US011387359B2

(12) United States Patent
Humbel et al.

(10) Patent No.: US 11,387,359 B2
(45) Date of Patent: Jul. 12, 2022

(54) PPOWER SEMICONDUCTOR DEVICE WITH ANTICORROSIVE EDGE TERMINATION STRUCTURE

(71) Applicant: Infineon Technologies AG, Neubiberg (DE)

(72) Inventors: Oliver Humbel, Maria Elend (AT); Josef-Georg Bauer, Markt Inderstorf (DE); Jens Brandenburg, Munich (DE); Diana Car, Munich (DE); Philipp Sebastian Koch, Gelugor (MY); Angelika Koprowski, Klagenfurt (AT); Sebastian Kremp, Warstein (DE); Thomas Kurzmann, Villach (AT); Erwin Lercher, Villach (AT); Holger Ruething, Munich (DE)

(73) Assignee: Infineon Technologies AG, Neubiberg (DE)

( * ) Notice: Subject to any disclaimer, the term of this patent is extended or adjusted under 35 U.S.C. 154(b) by 47 days.

(21) Appl. No.: 16/713,392

(22) Filed: Dec. 13, 2019

(65) Prior Publication Data
US 2020/0194585 A1    Jun. 18, 2020

(30) Foreign Application Priority Data

Dec. 14, 2018   (DE) ......................... 102018132237.2

(51) Int. Cl.
*H01L 29/78*     (2006.01)
*H01L 29/06*     (2006.01)
(Continued)

(52) U.S. Cl.
CPC ...... *H01L 29/7811* (2013.01); *H01L 29/0696* (2013.01); *H01L 29/66712* (2013.01); *H01L 29/7395* (2013.01)

(58) Field of Classification Search
CPC ............. H01L 29/7811; H01L 29/0696; H01L 29/66712; H01L 29/7395; H01L 29/0615;
(Continued)

(56) References Cited

U.S. PATENT DOCUMENTS

2015/0048450 A1    2/2015  Naito
2015/0060937 A1*   3/2015  Hikasa ................ H01L 29/0619
                                                              257/139
(Continued)

*Primary Examiner* — Mohammad M Hoque
(74) *Attorney, Agent, or Firm* — Murphy, Bilak & Homiller, PLLC

(57) ABSTRACT

A power semiconductor device having a power semiconductor transistor configuration includes: a semiconductor body having a front side coupled to a first load terminal structure, a backside coupled to a second load terminal structure, and a lateral chip edge; an active region for conducting a load current in a conducting state; and an edge termination region separating the active region and lateral chip edge. At the front-side, the edge termination region includes a protection region devoid of any metallic structure, unless the metallic structure is electrically shielded from below by a polysilicon layer that extends further towards the lateral chip edge than the metallic structure by a lateral distance of at least 20 μm. In a blocking state, the protection region accommodates a voltage change of at least 90% of a blocking voltage inside the semiconductor body in a lateral direction from the active region towards the lateral chip edge.

20 Claims, 8 Drawing Sheets

(51) Int. Cl.
   *H01L 29/66*       (2006.01)
   *H01L 29/739*      (2006.01)

(58) Field of Classification Search
   CPC ............... H01L 29/7813; H01L 29/417; H01L
                29/0619; H01L 29/402; H01L 29/7397;
                H01L 29/2003; H01L 29/1608; H01L
                29/20; H01L 29/0692; H01L 29/0684;
                H01L 29/7838; H01L 29/7393; H01L
            29/8613; H01L 29/6609; H01L 29/66477;
                                     H01L 29/66325
   USPC ......................................................... 257/329
   See application file for complete search history.

(56)           References Cited

U.S. PATENT DOCUMENTS

2016/0204192 A1    7/2016   Abiko et al.
2018/0047652 A1    2/2018   Papadopoulos et al.

* cited by examiner

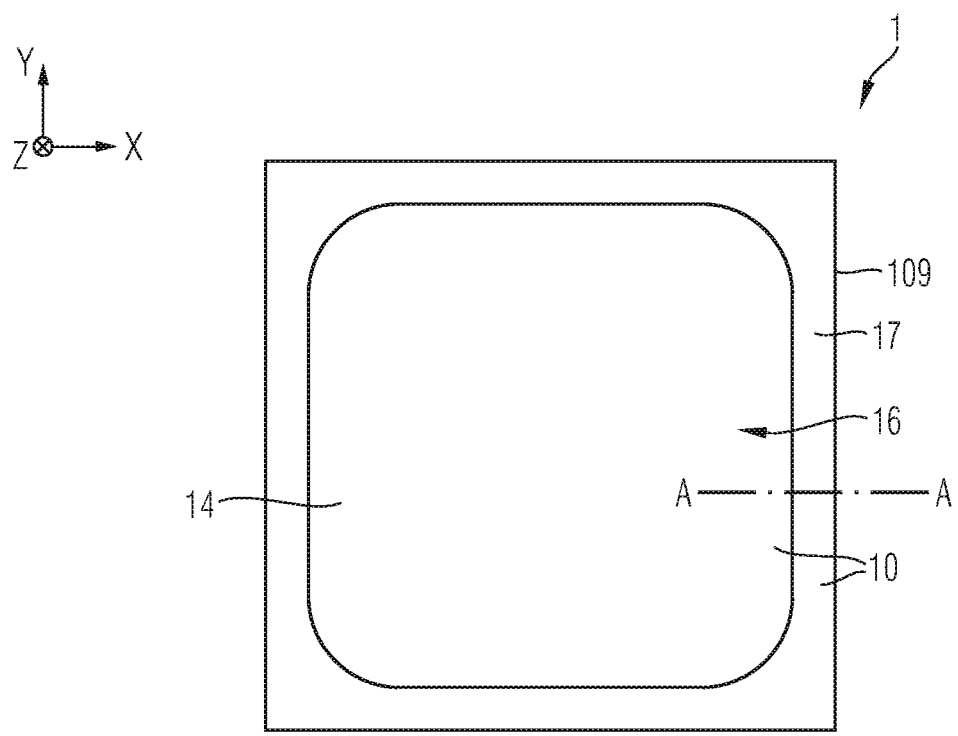

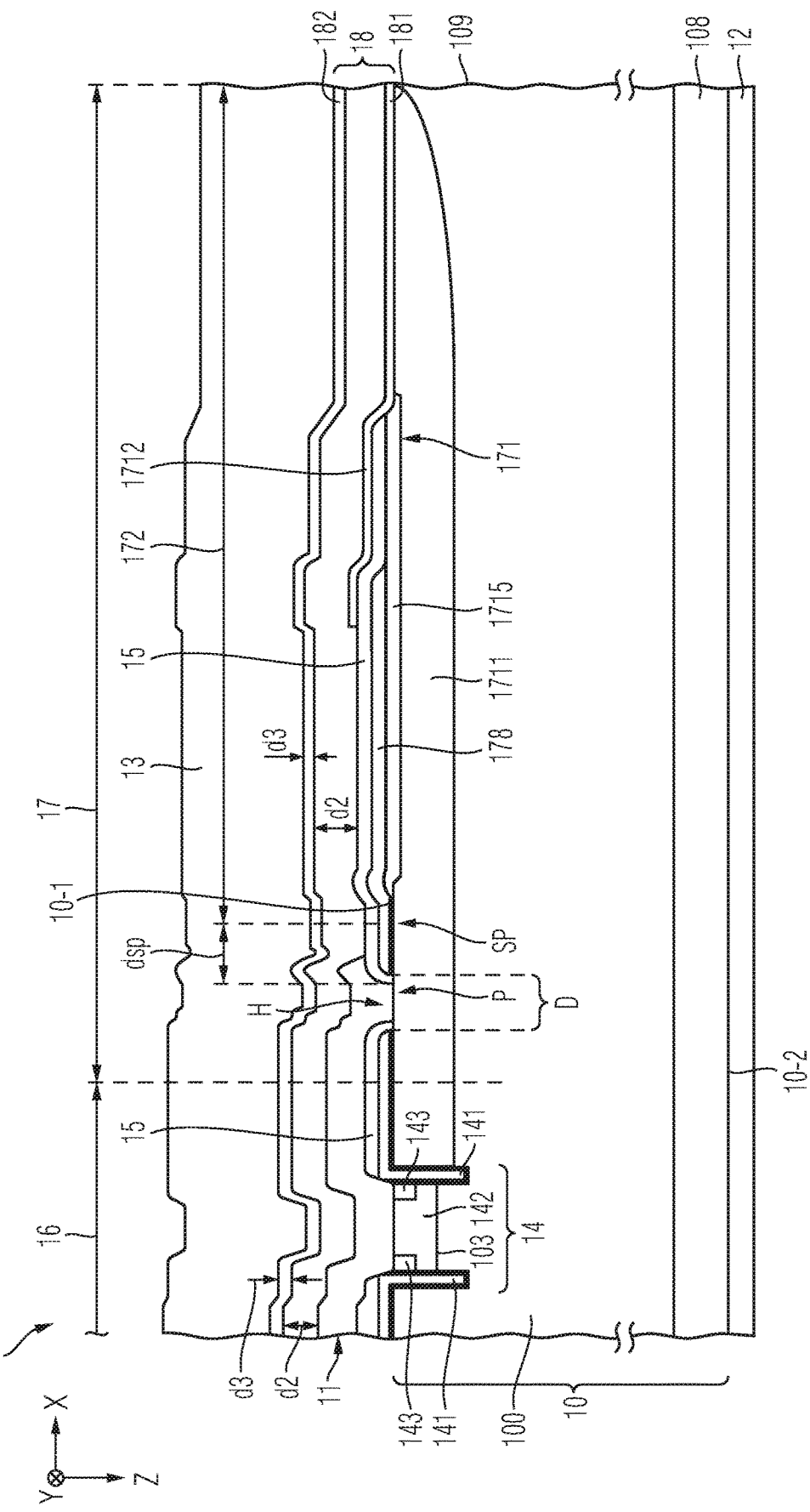

# PPOWER SEMICONDUCTOR DEVICE WITH ANTICORROSIVE EDGE TERMINATION STRUCTURE

TECHNICAL FIELD

This specification refers to embodiments of a power semiconductor device. In particular, this specification relates to embodiments of a power semiconductor device having a hard passivation layer arranged at least in a portion of an edge termination region.

BACKGROUND

Many functions of modern devices in automotive, consumer and industrial applications, such as converting electrical energy and driving an electric motor or an electric machine, rely on power semiconductor devices. For example, insulated gate bipolar transistors (IGBTs), metal oxide semiconductor field effect transistors (MOSFETs) and diodes, to name a few, have been used for various applications including, but not limited to switches in power supplies and power converters, e. g., in traction applications.

A power semiconductor device usually comprises a semiconductor body that is configured for conducting a load current along a load current path between two load terminals of the device. Further, in case the power semiconductor device has a transistor configuration, the load current path may be controlled by means of an insulated electrode, often referred to as gate electrode. For example, upon receiving a corresponding control signal from, e. g., a driver unit, the control electrode may set the power semiconductor device in one of a conducting state and a blocking state.

Further, for conducting the load current, the power semiconductor device may comprise one or more power cells, which may be arranged in a so-called active region of the power semiconductor device. The power semiconductor device may be laterally confined by an edge. Between the lateral edge and the active region that comprises the one or more power cells, there may be arranged an edge termination region, which may comprise an edge termination structure. Such an edge termination structure may serve for the purpose of influencing the course of an electric field within the semiconductor body, e. g., so as to ensure a reliable blocking capability of the power semiconductor device. The edge termination structure may comprise one or more components arranged within the semiconductor body, and also one or more components arranged above a surface of the semiconductor body.

A common example of such edge termination concepts is a combination of p-doped poly-silicon field rings with field plates, wherein the field plates may be configured for providing an effective screening of external charges. For example, the field plates may comprise a metal, such as aluminum. Alternatively, such field plates may be formed of polysilicon, e. g., in order to make the edge termination structure less susceptible to corrosion when exposed to humidity and electric fields. For example, in an edge termination structure combining p-doped field rings with n-doped poly-silicon field plates, metallic layers may still be present to provide an electric contact between a field plate and a field ring reducing the influence of an electric field on the outer edges of the metallic layers.

Usually, one or more passivation layers, such as a hard passivation comprising an oxide and a nitride, are provided in the edge termination region. For example, such a passivation layer may be arranged above an edge termination structure so as to protect the semiconductor surface including edge termination structure from electrical and chemical contaminants, such as ions.

It is generally desirable to provide edge termination and passivation concepts that are reliable even under harsh environmental conditions that are, for example, met in traction applications. To this end, it may be desirable to render edge termination structures less susceptible to corrosion under the combined influence of humidity and electric fields. Device performances under such conditions are usually tested by strongly accelerated reliability tests, such as, e. g., HV-H3TRB or $H_2S$.

SUMMARY

According to an embodiment, a power semiconductor device has a power semiconductor transistor configuration and comprises: a semiconductor body having a front side coupled to a first load terminal structure, a backside coupled to a second load terminal structure, and a lateral chip edge; an active region configured for conducting a load current between the first load terminal structure and the second load terminal structure in a conducting state of the power semiconductor device; and an edge termination region separating the active region from the lateral chip edge. At the front-side, the edge termination region comprises a protection region, which does not comprise any metallic structure, unless the metallic structure is electrically shielded from below by a polysilicon layer that extends further towards the lateral chip edge than the metallic structure by a lateral distance of at least 20 µm. In a blocking state of the power semiconductor device, the protection region is configured to accommodate a voltage change of at least 90% of a blocking voltage inside the semiconductor body in a lateral direction from the active region towards the lateral chip edge.

According to an embodiment, a power semiconductor device has a power semiconductor transistor configuration and comprises: a semiconductor body having a front side coupled to a first load terminal structure, a backside coupled to a second load terminal structure, and a lateral chip edge; an active region configured for conducting a load current between the first load terminal structure and the second load terminal structure in a conducting state of the power semiconductor device; and an edge termination region separating the active region from the lateral chip edge. At the front-side, the edge termination region comprises a protection region, which does not comprise any metallic structure, unless the metallic structure is electrically shielded from below by a polysilicon layer that extends further towards the lateral chip edge than the metallic structure by a lateral distance of at least 20 µm. In a vertical cross-section, the protection region extends along the lateral direction from a starting point to the lateral chip edge, wherein the starting point is located at a distance of at most 30 µm from an outermost point where a doped semiconductor region is in contact with a metal layer that is electrically connected with the first load terminal structure.

According to another embodiment, a power semiconductor device, comprises: a semiconductor body having a front side coupled to a first load terminal structure, a backside coupled to a second load terminal structure, and a lateral chip edge; an active region configured for conducting a load current between the first load terminal structure and the second load terminal structure in a conducting state of the power semiconductor device; an edge termination region separating the active region from the lateral chip edge; an insulation layer being arranged at the front side, wherein a lateral edge of the insulation layer defines at least one contact hole, the contact hole being filled with a metal layer that is in contact with a doped semiconductor region of the semiconductor body; and a hard passivation layer being arranged at the front side at least in a portion of the edge termination region in such a way that the hard passivation layer does not extend above the lateral edge of the insulation layer.

According to a further embodiment, a power semiconductor device comprises: a semiconductor body having a front side coupled to a first load terminal structure, a backside coupled to a second load terminal structure, and a lateral chip edge; an active region configured for conducting a load current between the first load terminal structure and the second load terminal structure in a conducting state of the power semiconductor device; an edge termination region separating the active region from the lateral chip edge; a hard passivation layer being arranged at the front side at least in a portion of the edge termination region, the hard passivation layer comprising an oxide layer having an oxide layer thickness; and a metal layer being arranged at the front side at least in a portion of the edge termination region and having a lateral edge, wherein, in a cross-section along a vertical direction pointing from the front side to the backside, the cross-section being perpendicular to the lateral edge, a common lateral extension range of the hard passivation layer and the metal layer amounts to at most 10 times the oxide layer thickness.

According to a further embodiment, a method of processing a power semiconductor device comprises the following steps: providing a semiconductor body having a front side, a backside, and a lateral chip edge; creating an active region that is configured for conducting a load current between a first load terminal structure arranged at the front side and a second load terminal structure arranged at the backside in a conducting state of the power semiconductor device; and creating an edge termination region that separates the active region from the lateral chip edge, wherein, at the front-side, the edge termination region comprises a protection region, which does not comprise any metallic structure, unless the metallic structure is electrically shielded from below by a polysilicon layer that extends further towards the lateral chip edge than the metallic structure by a lateral distance of at least 20 μm, and wherein, in a blocking state of the power semiconductor device, the protection region is configured to accommodate a voltage change of at least 90% of a blocking voltage inside the semiconductor body in a lateral direction from the active region towards the lateral chip edge.

According to another embodiment, a method of processing a power semiconductor device comprises the following steps: providing a semiconductor body having a front side, a backside, and a lateral chip edge; creating an active region that is configured for conducting a load current between a first load terminal structure arranged at the front side and a second load terminal structure arranged at the backside in a conducting state of the power semiconductor device; and creating an edge termination region that separates the active region from the lateral chip edge, wherein, at the front-side, the edge termination region comprises a protection region, which does not comprise any metallic structure, unless the metallic structure is electrically shielded from below by a polysilicon layer that extends further towards the lateral chip edge than the metallic structure by a lateral distance of at least 20 μm. In a vertical cross-section, the protection region extends along the lateral direction from a starting point to the lateral chip edge, wherein the starting point is located at a distance of at most 30 μm from an outermost point where a doped semiconductor region is in contact with a metal layer that is electrically connected with the first load terminal structure.

According to a further embodiment, a method of processing a power semiconductor device comprises the following steps: providing a semiconductor body having a front side, a backside, and a lateral chip edge; creating an active region that is configured for conducting a load current between a first load terminal structure arranged at the front side and a second load terminal structure arranged at the backside in a conducting state of the power semiconductor device; creating an edge termination region that separates the active region from the lateral chip edge; creating an insulation layer at the front side, such that a lateral edge of the insulation layer defines at least one contact hole; filling the contact hole with a metal layer so as to establish contact with a doped semiconductor region of the semiconductor body; and creating a hard passivation layer at the front side at least in a portion of the edge termination region in such a way that the hard passivation layer does not extend above the lateral edge of the insulation layer.

According to another embodiment, a method of processing a power semiconductor device comprises the following steps: providing a semiconductor body having a front side, a backside, and a lateral chip edge; creating an active region that is configured for conducting a load current between a first load terminal structure arranged at the front side and a second load terminal structure arranged at the backside in a conducting state of the power semiconductor device; creating an edge termination region that separates the active region from the lateral chip edge; creating a hard passivation layer at the front side at least in a portion of the edge termination region, the hard passivation layer comprising an oxide layer having an oxide layer thickness; and creating a metal layer at the front side at least in a portion of the edge termination region, the metal layer having a lateral edge, wherein, in a cross-section along a vertical direction pointing from the front side to the backside, the cross-section being perpendicular to the lateral edge, a common lateral extension range of the hard passivation layer and the metal layer amounts to at most 10 times the oxide layer thickness.

Those skilled in the art will recognize additional features and advantages upon reading the following detailed description, and upon viewing the accompanying drawings.

BRIEF DESCRIPTION OF THE DRAWINGS

The parts in the Figures are not necessarily to scale, emphasis being instead placed upon illustrating principles of the invention. Moreover, in the Figures, like reference numerals designate corresponding parts. In the drawings:

FIGS. 1A-1C each schematically and exemplarily illustrate a section of a vertical projection of a power semiconductor device in accordance with one or more embodiments;

FIG. 2 schematically and exemplarily illustrates a section of a vertical cross-section of a power semiconductor device in accordance with one or more embodiments;

DETAILED DESCRIPTION

Figure 1B:
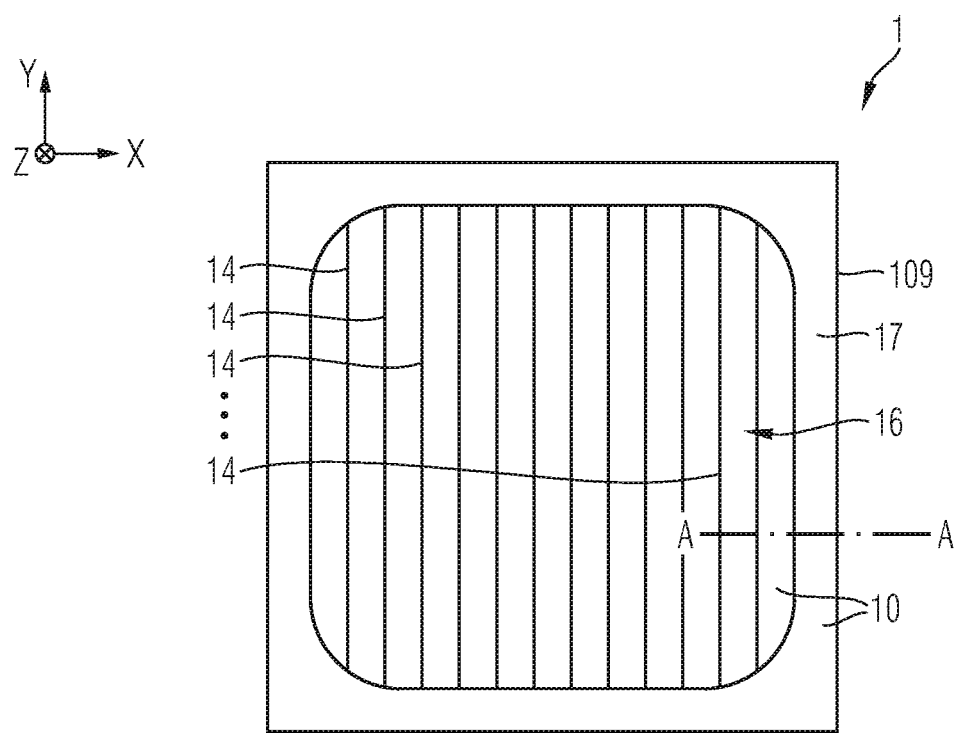

In the following detailed description, reference is made to the accompanying drawings which form a part hereof and in which are shown by way of illustration of specific embodiments in which the invention may be practiced.

In this regard, directional terminology, such as "top", "bottom", "below", "front", "behind", "back", "leading", "trailing", "below", "above" etc., may be used with reference to the orientation of the Figures being described. Because parts of embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the vertical direction Z mentioned below may be a vertical direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped, and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e. g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e. g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e. g., by means of an insulation, e. g., a dielectric.

Specific embodiments described in this specification pertain to, without being limited thereto, a power semiconductor device exhibiting a stripe cell or needle cell configuration, such as a power semiconductor transistor, that may be used within a power converter or a power supply. Thus, in an embodiment, the semiconductor device is configured for carrying a load current that is to be fed to a load and/or, respectively, that is provided by a power source. For example, the semiconductor device may comprise one or more active power unit cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e. g., up to several ten or hundred Ampere or even up to some kA, and/or high voltages, typically above 100 V, more typically 500 V and above, e. g., up to at least 1 kV, up to at least 6 kV. For example, the semiconductor device described below may be a semiconductor device exhibiting a stripe cell configuration or a needle cell configuration and can be configured for being employed as a power component in a low-, medium- and/or high voltage application.

For example, the term "power semiconductor device" as used in this specification is not directed to logic semiconductor devices that are used for, e. g., storing data, computing data and/or other types of semiconductor-based data processing.

Figure 1C:
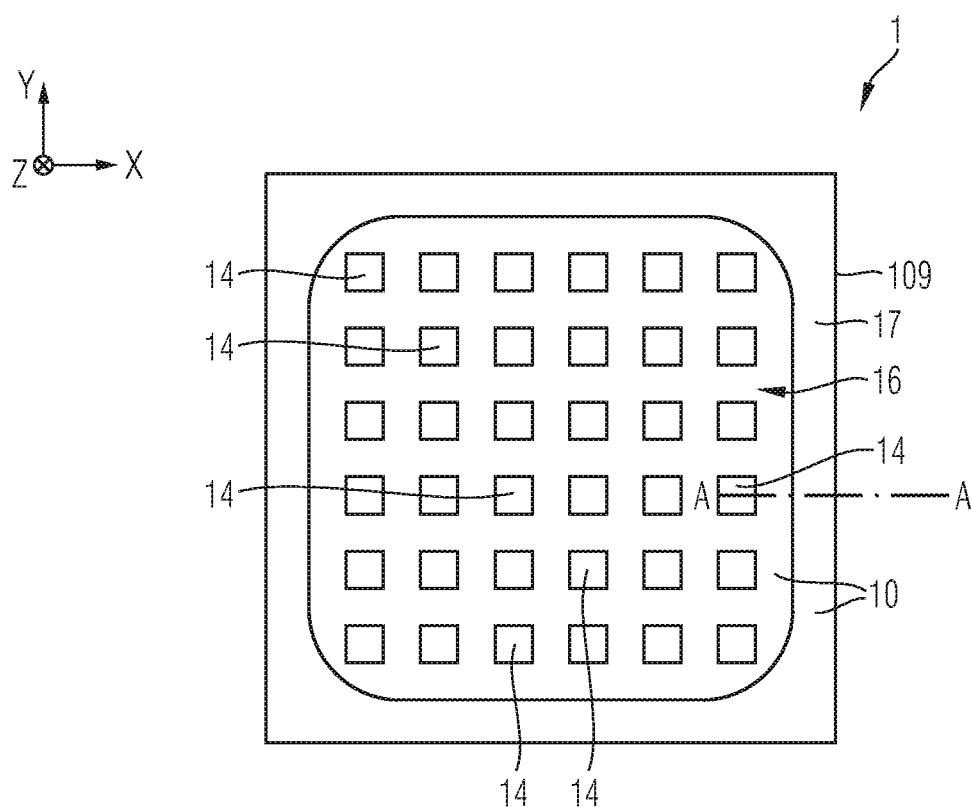

FIGS. 1A to 1C each schematically and exemplarily illustrate a section of a vertical projection of a power semiconductor device 1 in accordance with some embodiments. The illustrated vertical projection is in each case in parallel to a plane defined by a first lateral direction X and a second lateral direction Y and orthogonal to a vertical direction Z. The power semiconductor device 1 comprises a semiconductor body 10 having a lateral chip edge 109. Further, the power semiconductor device 1 exhibits an active region 16 that is configured for conducting a load current (e. g. substantially along the vertical direction Z) and an edge termination region 17 that is arranged laterally in between the chip edge 109 and the active region 16. As can be seen in each of FIGS. 1A to 1C, the active region 16 may be laterally surrounded by the edge termination region 17.

For example, the active region 16 comprises one or more power cells 14 that each extend at least partially into the semiconductor body 10. The present specification is not limited to a specific kind of configuration of the one or more power cells 14. Rather, the power cells 14 can exhibit any configuration that is common for a power semiconductor device, e. g., at least one of a diode configuration, a thyristor configuration, a MOS gated diode (MGD) configuration, a transistor configuration, such as an IGBT configuration, an RC (reverse conducting) IGBT configuration, a MOSFET configuration, and any configuration derived there from. The skilled person is acquainted with these kinds of configurations. Accordingly, in FIGS. 1A-C, the power cells 14 are only schematically illustrated, as the exact configuration is not a major subject of this specification.

For example, the configuration shown in FIG. 1A may correspond to a power diode configuration comprising a single power cell 14. By contrast, the configurations illustrated in FIGS. 1B and 1C may, for instance, represent semiconductor switch configurations (such, e. g., a MOSFET and/or IGBT configuration), wherein the power cells 14 may be configured for controlling a load current by switching the power semiconductor device 1 into one of a conducting state and a blocking state. Such power cells 14 may, for example, comprise a control structure such as a MOS-control structure. As exemplarily illustrated in FIG. 1B, the power cells 14 may exhibit a stripe configuration, which may extend, e. g., throughout the entire active region 16 along the second lateral direction Y. In another embodiment, as illustrated in FIG. 1C, the power cells 14 may exhibit a cellular configuration, e. g., having a horizontal cross-section exhibiting one of a quadratic shape, a rectangular shape, a rectangular shape with rounded corners, a circular shape, and an ellipsoidal shape.

The one or more power cells 14 that may be included in the active region 16 of the power semiconductor device 1 may be configured for selectively conducting a load current and for blocking a blocking voltage depending, e. g., on a switching state of the power semiconductor device 1 and/or on a direction in which a current and/or voltage is fed or applied to the power semiconductor device 1.

For example, the power semiconductor device 1, by means of the at least one power cell 14, may be configured for supporting a blocking voltage of at least 300 V, of at least 500 V, of at least 600 V, of at least 1000 V, of at least 1500 V, or of at least 3000 V, or of even more than 6000 V. Further, the at least one power cell 14 may exhibit a compensation structure which is also referred to as a "superjunction" structure.

For example, in order to control the one or more power cells 14, a control terminal (not illustrated) may be provided that may be configured for forwarding a control signal to a control electrode structure of the one or more power cells 14. For example, the control terminal can be a gate terminal. Thereby, the power semiconductor device 1 may be set into one of the conducting state and the blocking state. In an embodiment, such a control signal can be provided by means of applying a voltage between the control terminal and a first load terminal (not shown in FIGS. 1A-C).

In between the chip edge 109, which may have come into being, e. g., by means of wafer dicing, and the active region 16, there may be arranged an edge termination structure 171 (not shown in FIGS. 1A-C, refer to FIGS. 2 to 5). In other words, an edge termination structure 171 may be arranged in the edge termination region 17. For example, the edge termination structure 171 may entirely surround the active region 16. The edge termination structure 171 is not configured for conducting a load current, but rather configured for ensuring a reliable blocking capability of the power semiconductor device 1, in accordance with an embodiment. For example, the edge termination structure 171 comprises a field ring/field plate termination structure. Additionally or alternatively, the edge termination structure may comprise at least one of a junction-termination-extension (JTE) structure and a variation-of-lateral-doping (VLD) structure. The person skilled in the art is acquainted with these kinds of edge termination structures.

Figure 5:
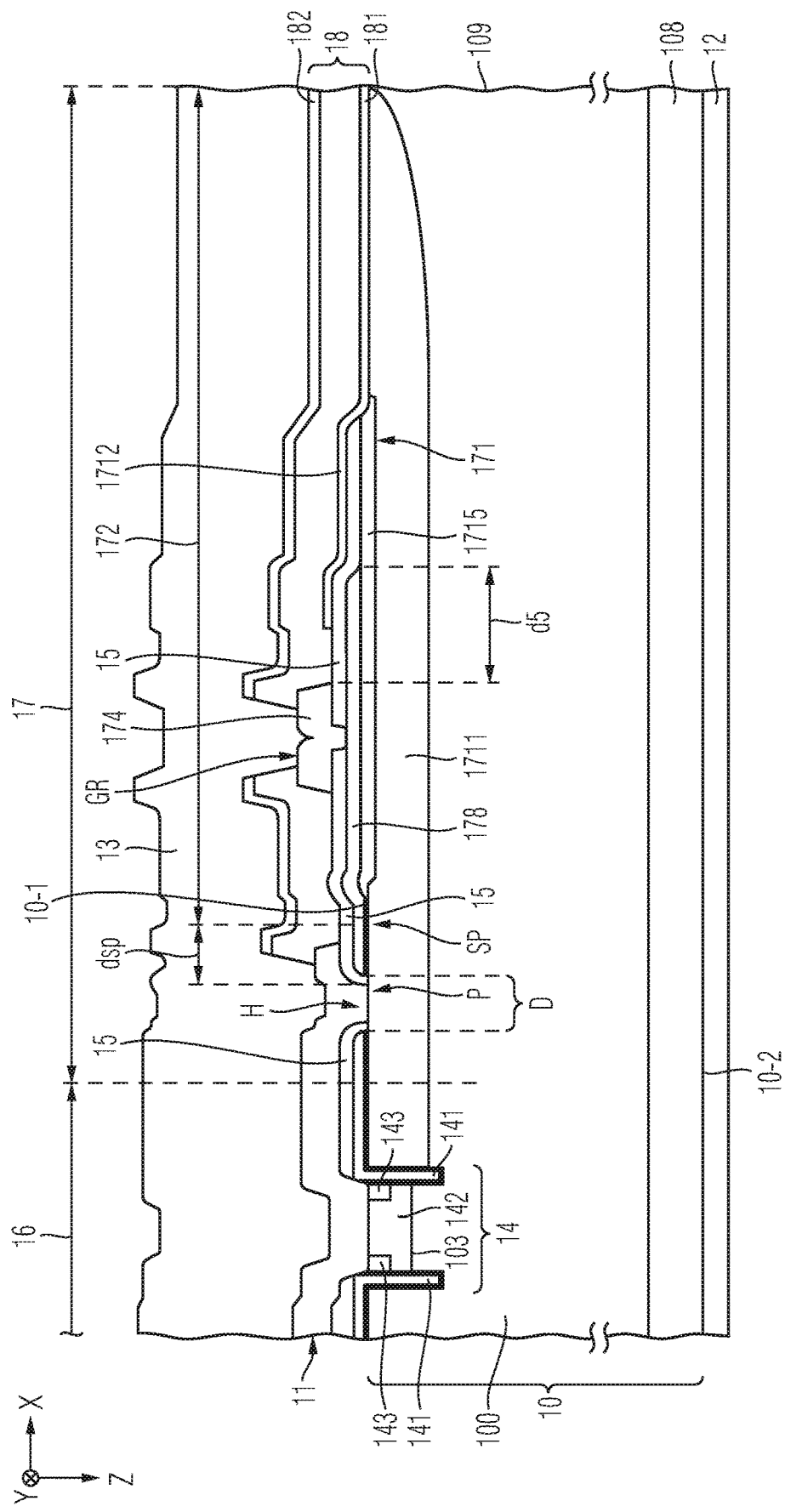
FIG. 5 schematically and exemplarily illustrates a section of a vertical cross-section of a power semiconductor device in accordance with one or more embodiments.
Figure 6:
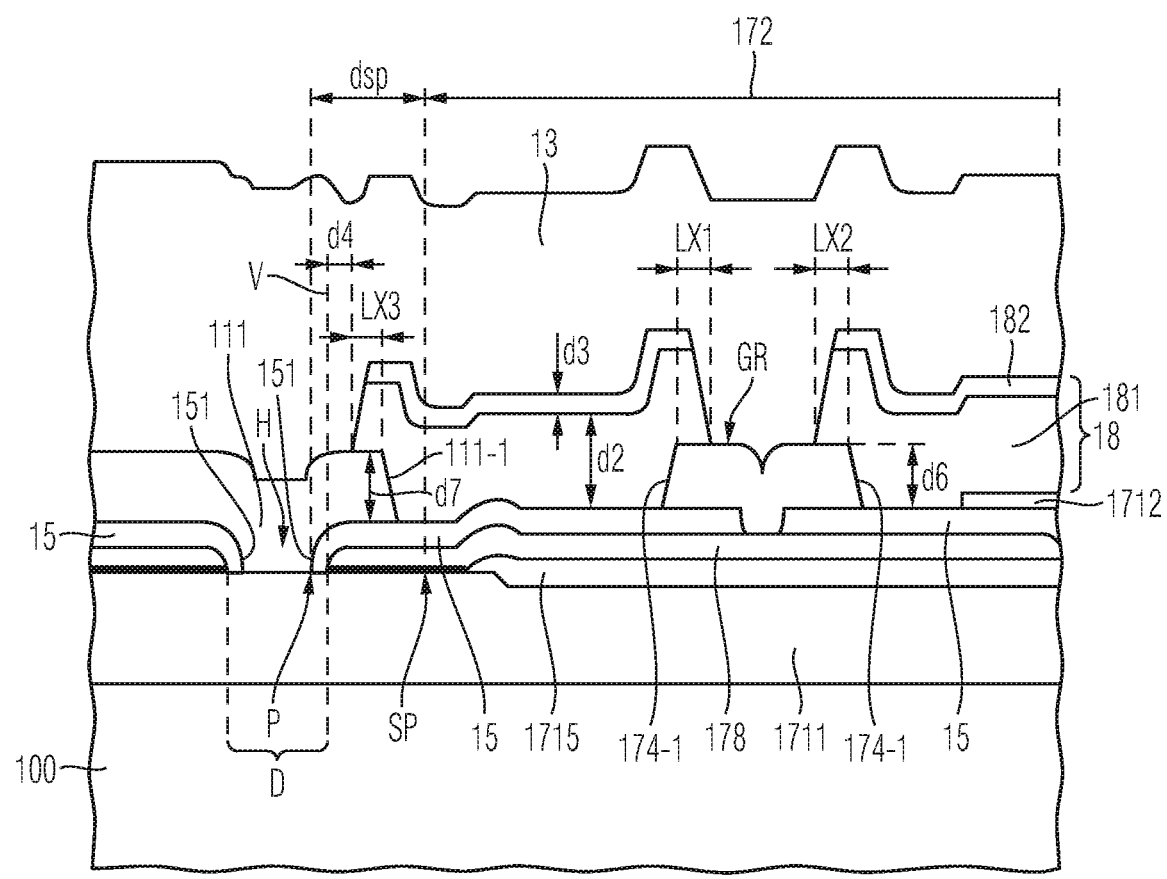
FIG. 6 shows an enlarged view of a section of FIG. 5.

FIGS. 2 to 6 each schematically and exemplarily illustrate a section of a vertical cross-section of the power semiconductor device 1 in accordance with some embodiments. The illustrated cross-sections are in parallel to a plane defined by the first lateral direction X and the vertical direction Z, wherein each of the illustrated components may also extend along the second lateral direction Y. FIG. 6 shows an enlarged view of a section of FIG. 5.

The sections of the vertical cross-sections shown in FIGS. 2 to 6 are in each case located close to the lateral chip edge 109 of the semiconductor body 10 and include a vertical cross-section of at least a portion of the edge termination region 17. In addition, a peripheral portion of the active region 16 adjacent to the edge termination region 17 is illustrated in each of FIGS. 2 to 5.

The semiconductor body 10 is coupled to each of a first load terminal structure 11 and a second load terminal structure 12 of the power semiconductor device 1. The first load terminal structure 11 may be, for example, an anode terminal, an emitter terminal, or a source terminal (depending on the type of power semiconductor device) being arranged on a front side 10-1 of the semiconductor body 10. Correspondingly, the second load terminal 12 may be, for example, a cathode terminal, a collector terminal, or a drain terminal being arranged on a backside 10-2 of the semiconductor body 10. For example, the first load terminal 11 and/or the second load terminal 12 may comprise respective front side or backside metalizations. The front side metalization may comprise a copper and/or an aluminum metalization.

The semiconductor body 10 comprises a drift region 100 of a first conductivity type (e. g., n-type). In an embodiment, the drift region 100 is an n$^-$-doped region. As depicted in FIGS. 2 to 5, the drift region 100 may extend into each of the active region 16 and the edge termination region 17 of the power semiconductor device 1. Each of the one or more power cells 14 that may be included in the active region 16 of the power semiconductor device 1 may comprise a part of said drift region 100. Further, each of the one or more power cells 14 may be configured for conducting a load current via said drift region 100 between the load terminal structures 11 and 12, and for blocking a blocking voltage applied between said load terminal structures 11 and 12.

For example, in some embodiments in accordance with each of FIGS. 1B to 6, the power semiconductor device 1 may be a switching device, such as, e. g., an IGBT or a MOSFET. In this case, the active region 16 comprises a plurality of power cells 14, wherein each power cell 14 may, e. g., comprise a trench-gate structure, as schematically depicted in FIGS. 2 to 5, which show in each case one outermost power cell 14 of the active region 16. For example, the trench-gate structure may be arranged in one of a stripe configuration, as illustrated in FIG. 1B, and a cellular configuration (e. g., exhibiting a quadratic or rectangular shape in a horizontal cross-section), as exemplarily illustrated in FIG. 1C. For example, each of the power cells 14 may comprise a control electrode (not depicted in the Figures) arranged inside a trench 141, wherein the control electrode may be configured for receiving a control signal, such as a gate voltage, from a control terminal of the power semiconductor device 1 (not illustrated). For example, within each power cell 14, the control electrode may be electrically insulated from the first load terminal by means of an insulation structure, such as an oxide structure, as is well known to those skilled in the art.

Further, each of the cells 14 may comprise a body region 142 of the second conductivity type (e. g., p-type) and at least one source region 143 of the first conductivity type, the source region 143 being arranged in contact with the first load terminal 11, wherein the body region 142 isolates the at least one source region 143 from the drift region 100. As shown in each of FIGS. 2 to 5, a transition between the body region 102 and the drift region 100 may form a pn-junction 103 being configured for blocking a blocking voltage that is applied in forward direction between the first load terminal 11 and the second load terminal 12. Inside each power cell 14, the respective control electrode may be electrically insulated from each of the source region 143, the body region 142, and the drift region 100 by an insulation structure, such as a gate oxide (schematically indicated with a fat line in FIGS. 2-6). For example, the control electrode may be configured for inducing a transport channel, such as, e. g., an n-channel, in the body region 142 between the source region 143 and the drift region 100 in dependence on the control signal, thereby enabling the conducting state of the power semiconductor device 1. Instead of such trench cells 14, the power semiconductor device 1 may be equipped with so called planar power switching cells, wherein the gate electrode is located vertically above the semiconductor body 10 (not shown in the Figures). The skilled person is acquainted with the principles and variants of configurations of such trench-based or planar power switching cells 14, and they will therefore not be explained in further detail.

As is also well known to those skilled in the art, in case the power semiconductor device has an IGBT configuration, the semiconductor body 10 may further comprise a backside emitter region 108 of the second conductivity type (e. g., p-type) that is arranged at the backside 10-2 in contact with the second load terminal 12. In another variant, wherein the power semiconductor device 1 is configured, e. g., as a MOSFET, such a backside emitter region 108 may be absent and may be replaced by a highly doped region (drain) of the first conductivity type.

It should be noted that the transistor power cell 14 depicted in each of FIGS. 2 to 5 is just an exemplary realization of a power cell in the active region 16. For example, in an alternative embodiment in accordance with FIG. 1A, there may be provided a single large power cell 14, which may be configured as a power diode cell. For example, the power diode cell 14 comprises an anode region of a second conductivity type (e. g., p-type), wherein the anode region is arranged in contact with the first load terminal 11. Further, a transition between the anode region and the drift region 100 forms a pn-junction that is configured for blocking a blocking voltage between the first load terminal 11 and the second load terminal 12. Thus, while the cross sections shown in FIGS. 2 to 5 illustrate by way of example in each case an active region 16 comprising a power cell 14 having trench-gate structure, aspects related to the configuration of the edge termination region 17 that will be explained in the following may as well refer to embodiments of the power semiconductor device 1 having a diode configuration, e. g., in the form of a single large power cell 14 inside the active region 16.

Turning now to the edge termination region 17, in accordance with all embodiments illustrated in FIGS. 1A to 6, said edge termination region 17 may comprise an edge termination structure 171 that is not configured for conducting a load current, but rather configured for ensuring a reliable blocking capability of the power semiconductor device 1. The edge termination structure 171 may be configured for laterally terminating an electric field that is present in the semiconductor body 10 in a blocking state of the power semiconductor device 1. For example, such an edge termination structure 171 may comprise at least one of a junction-termination-extension (JTE) structure, a field ring/field plate termination structure, a variation-of-lateral-doping (VLD) structure, and a combined VLD-DLC edge termination structure. The skilled person is acquainted with these kinds of edge termination structures as such.

In the exemplary embodiments illustrated in FIGS. 2 to 5, the edge termination structure 171 comprises a doped semiconductor region 1711 of the second conductivity type. For example, the doped semiconductor region 1711 may exhibit a variation of lateral doping (VLD). Further, in the embodiments of FIGS. 2 to 5, the edge termination structure 171 may comprise an electrically active semi-insulating layer 1712 that is arranged above a portion of the doped semiconductor region 1711. For example, the semi-insulating layer 1712 is electrically insulated from the doped semiconductor region 1711 by at least one insulation layer 15, such as an oxide. The semi-insulating layer 1712 may, for example, comprise at least one of: amorphous silicon (a-Si), semi-insulating poly-crystalline silicon (SIPOS), and an electro-active material, such as diamond-like carbon (DLC) or hydrogenated amorphous carbon (a-C:H). For example, such an electrically active semi-insulating layer may have an electric resistivity in a range from 1E07 $\Omega$cm to 1E15 $\Omega$cm. It may thus be configured for ensuring a relatively high electric blocking capability. At the same time, the electric resistivity may be low enough to prevent the accumulation of electric charges, e. g., in a region of the semiconductor body 10 close to the hard passivation layer 18.

In an embodiment in accordance with each of FIGS. 2 to 6, a hard passivation layer 18 is arranged at the front side 10-2 inside the edge termination region 17. The hard passivation layer 18 may extend at least above a portion of an edge termination structure 171, as illustrated in the Figures. For example, in an embodiment in accordance with FIGS. 2 and 3, the hard passivation layer 18 may cover the entire edge termination region 17 and may optionally also extend further into the active region 16, as exemplarily illustrated in FIG. 2. In other embodiment, the hard passivation layer 18 may, for example, comprise several disconnected portions.

In an embodiment, the hard passivation layer 18 comprises an oxide layer 181. For example, the oxide layer 181 may have an oxide layer thickness d2. The oxide layer thickness d2 may be, e. g., in the range from 50 nm to 5000 nm, for example 2700 nm. In addition, in an embodiment, the hard passivation layer 18 may comprise a nitride layer 182 For example, the nitride layer 182 may be arranged above the oxide layer 181, such as on top of the oxide layer 181. Such a nitride layer 182 may have a nitride layer thickness d3 that amounts to at least 100 nm, such as at least 400 nm, or even at least 800 nm.

Further, in an embodiment, the edge termination region 17 comprises a protection region 172. The protection region 172 is arranged at the front side 10-1 of the semiconductor body 10 and does not comprise any metallic structure. This is exemplarily illustrated in FIGS. 2 and 3. It should be noted that in this context a structure consisting of polysilicon is not to be understood as a metallic structure. Further, in the present context, the statement that the protection region 172 does not comprise any metallic structure means that no metallic structure that has been created at wafer level, such as, e. g., a gate runner electrode or a metal-filled contact hole, is present inside the protection region 172. In other words, a metallic structure that may have been arranged, for example, as part of a package of the power semiconductor device 1 in a later assembly step (e. g., bond wires) are not to be understood as "metallic structures" in the context of this specification.

In another embodiment, a protection region 172 may be provided in the edge termination region 17, wherein the protection region 172 does not comprise any such metallic structure unless the metallic structure is electrically shielded from below by a polysilicon layer 178. This is exemplarily illustrated in FIG. 4. In the exemplary embodiment shown in FIG. 4, a gate runner electrode GR is arranged at the front side 10-1 inside the edge termination region 17. Such a gate runner electrode GR may be provided for distributing a control signal, which may stem, e. g., from a gate driver, to the control electrodes of a plurality of transistor cells 14 which may be arranged in different regions of the active region 16. The function and design of such gate runner electrodes is well known to those skilled in the art and will therefore not be described in further detail. As exemplarily illustrated in FIG. 4, a polysilicon layer 178 extends below the gate runner electrode GR. The polysilicon layer 178 may be configured for shielding the gate runner electrode GR from below. This is to say that the polysilicon layer 178 may screen the gate runner electrode GR from an electric field that may be present in the semiconductor body 10 in the vicinity of the front side 10-1, e. g., in the blocking state of the power semiconductor device 1. For example, the polysilicon layer 178 may be embedded in an insulation structure, which may be formed, e. g., by oxide layers 1715, 15, as exemplarily illustrated in FIG. 4.

In a variant embodiment, such a polysilicon layer 178 that screens a metallic structure inside the edge termination region 17 extends further towards the lateral chip edge 109 than the metallic structure by a lateral distance d5 of at least 15 µm, such as at least 20 µm or even at least 50 µm. This is exemplarily depicted in FIG. 4, wherein the metallic structure is a gate runner electrode GR, as described above.

In accordance with the exemplary embodiments that are illustrated in each of FIGS. 2 to 6, it may be provided that, in a blocking state of the power semiconductor device 1, the protection region 172 is configured to accommodate a voltage change of at least 90% of a blocking voltage inside the semiconductor body in a lateral direction from the active region 16 towards the lateral chip edge 109. For example, the voltage may change by at least 90% along the lateral direction X inside the protection region 172. For example, such a lateral voltage change at the front side 10-1 of the semiconductor body 10 may be achieved by means of an edge termination structure 171 as described above, wherein the edge termination structure 171 may be arranged at least partially inside the protection region 172.

In an embodiment, in a vertical cross-section as exemplarily depicted in each of FIGS. 2 to 6, the protection region 172 extends along the lateral direction X from a starting point SP to the lateral chip edge 109. The starting point SP may be located at a distance dsp of at most 5 µm, such as at most 10 µm or at most 30 µm from an outermost point P where a doped semiconductor region 1711 is in contact with a metal and/or polysilicon layer 111 that is electrically connected with the first load terminal structure 11. For example, in this context, "outermost" is to be understood as being situated closest to the lateral chip edge 109 (as compared to all other points in the vertical cross-section where a doped semiconductor region is in contact with a metal layer that is electrically connected with the first load terminal structure). The doped semiconductor region 1711 may be of the second conductivity type. For example, the doped semiconductor region 1711 may form a part of an edge termination structure 171, as is exemplarily illustrated in FIGS. 2 to 4. In the exemplary embodiments of FIGS. 2 to 4, the portion of the doped semiconductor region 1711 that is in contact with the metal and/or polysilicon layer 111 forms a part of a drainage cell D that is configured for draining holes from the semiconductor body 10 in certain operating states of the power semiconductor device 1. In other embodiments (not illustrated) the doped semiconductor region that is in contact with the metal layer may be, e. g., a body region of an outermost power cell of the active region 16. For example, the metal and/or polysilicon layer 111 may form a part of the first load terminal structure 11.

In an embodiment, the hard passivation layer 18 does not extend further towards the active region 16 than the protection region 172 (not illustrated). More generally, in case the hard passivation layer 18 comprises an oxide layer 181 having an oxide layer thickness d2, it may be provided that the hard passivation layer 18 may extend further towards the active region 16 than the protection region 172 at most by a lateral distance of 10 times the oxide layer thickness d2. Such a situation is schematically and exemplarily depicted in FIG. 3.

Further, in an embodiment in accordance with each of FIGS. 2 to 6, a soft passivation layer 13 may arranged above at least a portion of the hard passivation layer 18. For example, the soft passivation layer 13 comprises an organic material, such as polyimide and/or an epoxy compound. It should be understood that, in the context of this specification, the term "soft passivation layer" shall designate a dielectric layer that is or has been created at wafer level, such as by deposition on a semiconductor wafer. In other words, material layers that may have been arranged, for example, as a part of a package of the power semiconductor device 1 in a later assembly step (e. g., a molding compound) are not to be understood as "soft passivation layer".

In an embodiment, the soft passivation layer 13 may cover the entire edge termination region 17 (cf., e. g., FIG. 2). Further, in an embodiment, the soft passivation layer 13 may also be arranged above the front-side 10-1 in a considerable portion of the active region 16.

Figure 3:
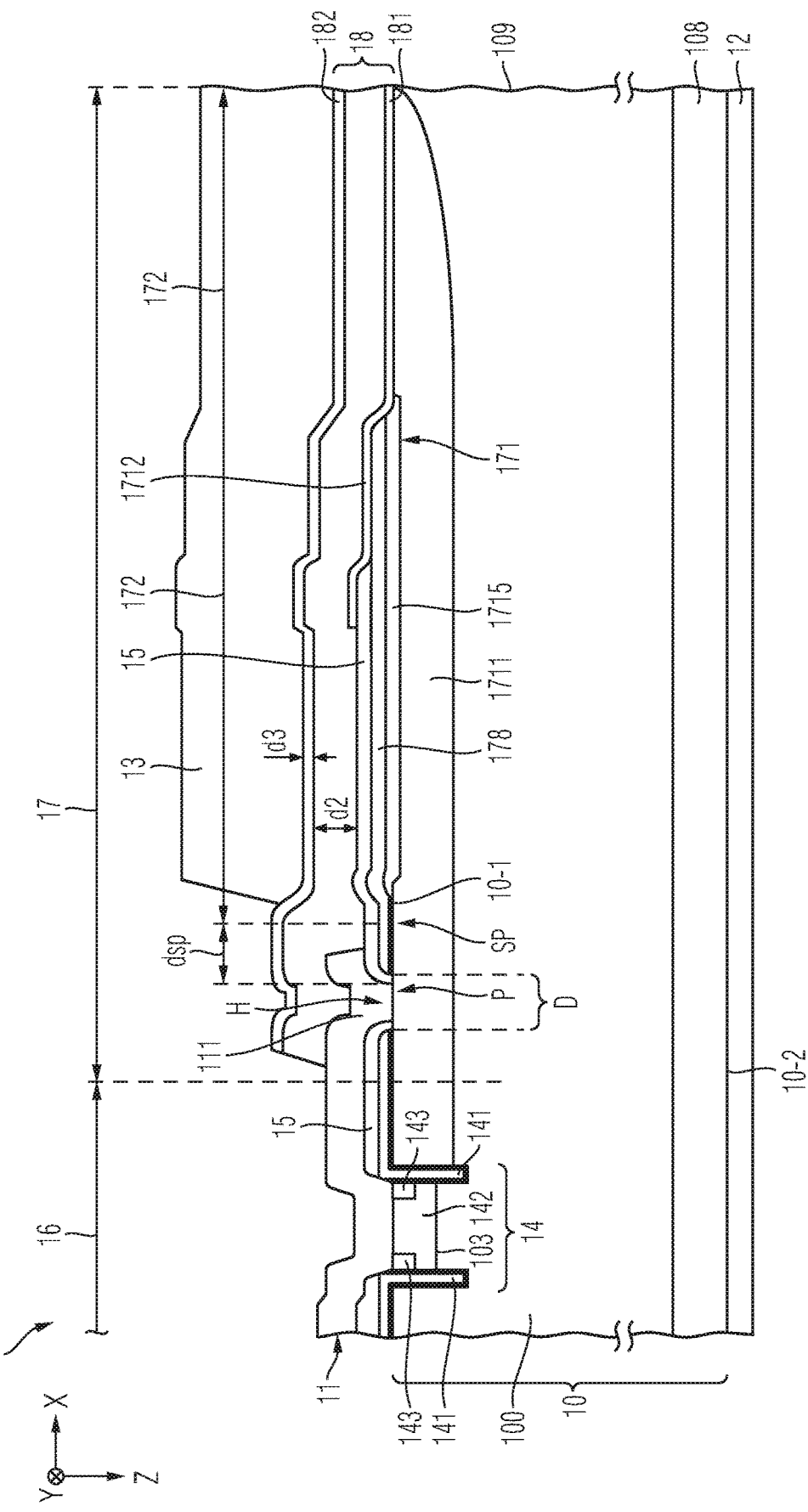
FIG. 3 schematically and exemplarily illustrates a section of a vertical cross-section of a power semiconductor device in accordance with one or more embodiments.
Figure 4:
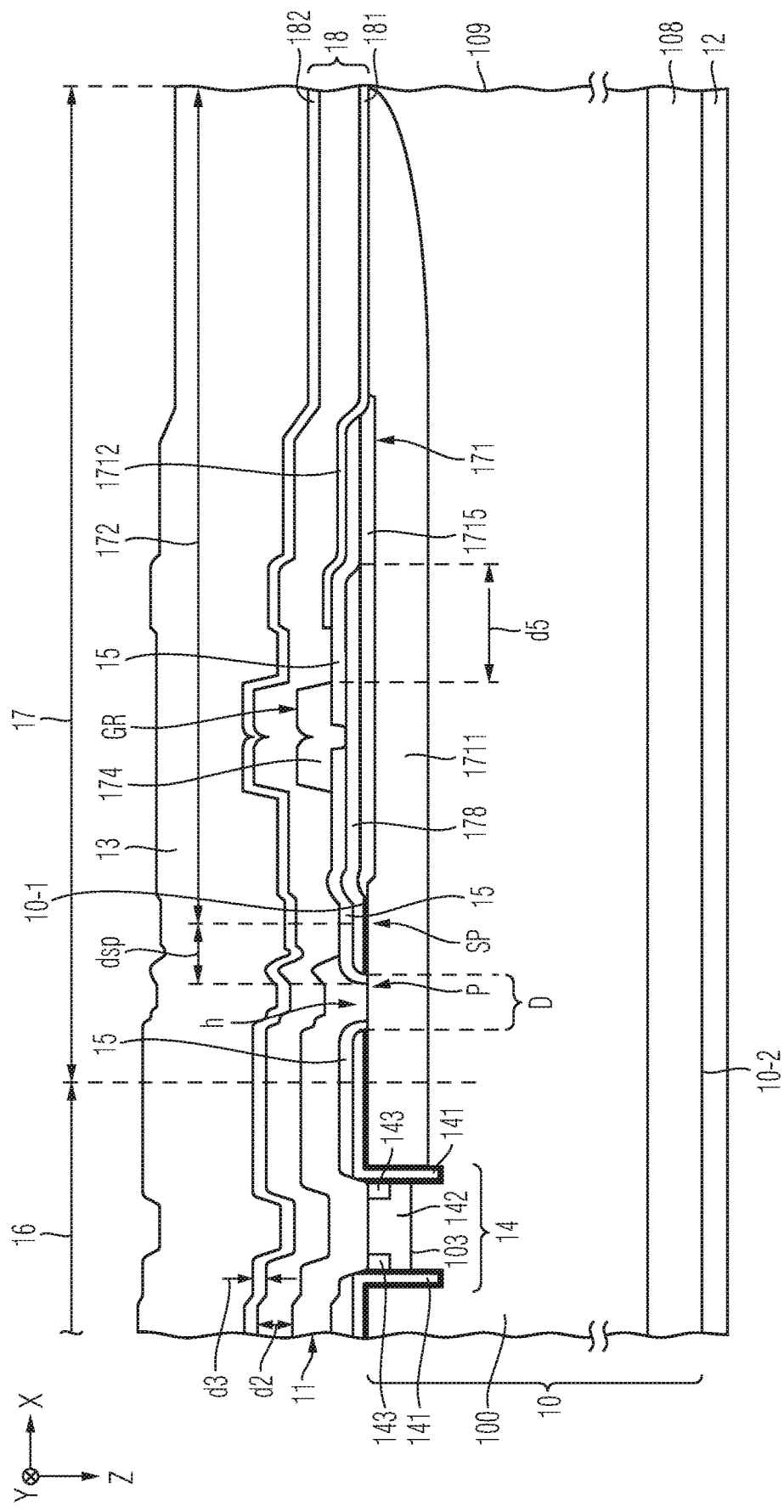
FIG. 4 schematically and exemplarily illustrates a section of a vertical cross-section of a power semiconductor device in accordance with one or more embodiments.

In another embodiment, as exemplarily illustrated in FIG. 3, the soft passivation layer 13 does not extend further towards the active region 16 than the protection region 172. For example, in that case, the hard passivation layer 18 may laterally extend further towards the active region 16 than the soft passivation layer 13. For example, the hard passivation layer 18 may extend further towards the active region 16 than the soft passivation layer 13 by at least 2 µm, such as by at least 5 µm, or even by at least 10 µm.

In an embodiment, in accordance with each of FIGS. 2 to 6, the power semiconductor device 1, may comprise an insulation layer 15 being arranged at the front side 10-1, wherein a lateral edge 151 of the insulation layer 15 defines at least one contact hole H. The contact hole H may be filled with a metal and/or polysilicon layer 111. For example, the metal and/or polysilicon layer 111 is in contact with a doped semiconductor region 1711 of the semiconductor body 10. In the exemplary embodiments of FIGS. 2 to 6, the metal and/or polysilicon layer 111 is electrically connected with the first load terminal structure 11 so as to establish an electrical connecting of a drainage cell D to the first load terminal structure 11, as described earlier. It should be noted that the contact hole H may also be extended in a lateral direction (e. g. along the second lateral direction Y) so as to form an elongate contact groove. For example, the lateral edge 151 of the insulation layer 15 may define a pronounced step topography at the front side 10-1 of the semiconductor body 10.

As exemplarily illustrated in more detail in FIG. 6, which provides an enlarged view of a section of FIG. 5, the hard passivation layer 18 may be arranged at the front side 10-2 at least in a portion of the edge termination region 17 in such a way that the hard passivation layer 18 does not laterally extend across a vertical projection V of the lateral edge 151 of the insulation layer 15. In other words, the hard passivation layer 18 may be arranged in such a way that it does not extend in a region that is located above the lateral edge 151 of the insulation layer 15. For example, in case the hard passivation layer 18 comprises an oxide layer 181 having an oxide layer thickness d2, as described earlier, it may be provided that the hard passivation layer 18 laterally terminates at a minimum distance d4 of at least 1 times, such as at least 5 times, or even at least 10 times the oxide layer thickness d2 from the vertical projection V of the lateral edge 151 of the insulation layer 15. In a further development, it may be provided that the hard passivation layer 18 laterally terminates at a minimum distance d4 of at least 1 µm from the lateral edge 151 of the insulation layer 15 in case the oxide layer thickness d2 is equal to or smaller than 1 µm.

In an embodiment, the metal and/or polysilicon layer 111 that fills the contact hole H may be covered at least partially by a soft passivation layer 13, such as, e. g., a polyimide layer 13 as described above. This is schematically illustrated in FIG. 6, wherein the dot-dashed line shall indicate that the soft passivation layer 13 may optionally extend further towards the active region 16, thus covering the metal and/or polysilicon layer 111 in the contact hole H.

Further, as illustrated in FIG. 6, the power semiconductor device 1 may comprise one or more metal layers 111, 174 being arranged at the front side 10-1 at least in a portion of the edge termination region 17. For example, such a metal layer 111 establishes an electrical connection between a drainage cell D and the first load terminal 11, as described previously. Additionally or alternatively, a metal layer 174 may form at least a portion of a gate runner electrode GR, as has also been described above.

The metal layer 111, 174 in each case exhibits at least one lateral edge 111-1, 174-1. For example, the lateral edge 111-1, 174-1 defines a step topography. Further, as mentioned above, the hard passivation layer 18, which may comprise an oxide layer 181 having an oxide layer thickness d2, extends at least in a portion of the edge termination region 17.

In an embodiment in accordance with FIG. 6, it may be provided that, in a cross-section along a vertical direction Z pointing from the front side 10-1 to the backside 10-2, the cross-section being perpendicular to the respective lateral edge 111-1, 174-1, a respective common lateral extension range LX1, LX2, LX3 of the hard passivation layer 18 and the respective metal layer 111, 174 amounts to at most 10 times the oxide layer thickness d2. For example, the respective common lateral extension range LX1, LX2, LX3 may start at the respective lateral edge 111-1, 174-1. Additionally or alternatively, it may be provided that said common lateral extension range LX1, LX2, LX3 amounts to at most 10 times a metal layer thickness d6, d7 of the respective metal layer 111, 174 as measured at the respective lateral edge 111-1, 174-1.

In a variant embodiment, it may be provided that at any such lateral edge of a metal layer that may be present inside the edge termination region 17 said common lateral extension range of the hard passivation layer 18 and the respective metal layer amounts to at most 10 times the oxide layer thickness and/or to at most 10 times a metal layer thickness of the respective metal layer at the respective lateral edge of the metal layer.

Further, a soft passivation layer 13 (comprising, e. g., polyimide) may be arranged above at least a portion of the hard passivation layer 18, such as on top of the hard passivation layer 18, as described above. The soft passivation layer 13 may also extend above a portion of the respective metal layer 111, 174 or above the entirety of the metal layer 111, 174. This is schematically illustrated in each of FIGS. 6 and 7, wherein the dot-dashed line shall indicate that the soft passivation layer 13 may optionally extend further towards the active region 16, thus covering the metal layer 111, 174.

Embodiments of a method of processing a power semiconductor device correspond to the embodiments of the power semiconductor as described above with respect to the Figures. Hence, for example, the features of the embodiments of the power semiconductor device described above with reference to the Figures may be achieved by carrying out corresponding processing method steps. Embodiments of a method of processing a power semiconductor device may thus comprise providing a semiconductor body 10 and forming the respective structures being arranged in/on the semiconductor body 10, e. g., by processes such as masked implantation of dopants and deposition of semiconductor and/or oxide layers.

The embodiments described above include the recognition that the reliability of a power semiconductor device, such as its ruggedness under high voltage and high humidity operating condition, may be improved significantly by respecting certain design rules with respect to the arrangement of metallic structures and/or passivation layers in an edge termination region of the power semiconductor device.

In accordance with one or more embodiments, a protection region may be provided inside an edge termination region at the front side of a power semiconductor device, wherein the protection region does not comprise any metallic structure, unless the metallic structure is electrically shielded from below by a polysilicon layer that extends further towards a lateral chip edge than the metallic structure by a lateral distance of at least 20 µm, and wherein, in a blocking state of the power semiconductor device, the protection region is configured to accommodate a voltage change of at least 90% of a blocking voltage inside the semiconductor body in a lateral direction from the active region towards the lateral chip edge. For example, by providing such a protection region it may be avoided from the outset that metallic structures, which may be covered by a hard passivation layer, are exposed to high electric field strengths during operation of the power semiconductor device.

Further, in accordance with one or more embodiments, an insulation layer is arranged at the front side of the power semiconductor device, wherein a lateral edge of the insulation layer defines at least one contact hole, the contact hole being filled with a metal layer that is in contact with a doped semiconductor region of the semiconductor body. A hard passivation layer is arranged at the front side at least in a portion of the edge termination region in such a way that the hard passivation layer does not extend above the lateral edge of the insulation layer.

Further, in accordance with one or more embodiments, a metal layer and a hard passivation layer comprising an oxide layer are arranged at the front side of a power semiconductor device at least in a portion of an edge termination region. The metal layer exhibits a lateral edge. In a cross-section along a vertical direction pointing from the front side to the backside of the power semiconductor device, the cross-section being perpendicular to the lateral edge, a common lateral extension range of the hard passivation layer and the metal layer amounts to at most 10 times the oxide layer thickness.

For example, by keeping the lateral edges of contact holes free from a hard passivation layer and/or by avoiding a tight encapsulation of a metal layer edge by a hard passivation layer, an exchange of ions with the environment may still possible, thus mitigating or preventing crevice corrosion of the metal layer. For example, instead of a crevice corrosion, the metal layer may undergo a moderate self-limiting corrosion which may not be detrimental to the reliability of the edge termination.

Features of further embodiments are defined in the dependent claims. The features of further embodiments and the features of the embodiments described above may be combined with each other for forming additional embodiments, as long as said features are not explicitly described as being alternative to each other.

In the above, embodiments pertaining to a power semiconductor device, such as a diode, a MOSFET, or an IGBT, and corresponding processing methods were explained. For example, these devices are based on silicon (Si). Accordingly, a monocrystalline semiconductor region or layer, e. g., the semiconductor body 10 and its regions/zones, such as regions 100, 108, 142, 143, 103, and 1711, can be a monocrystalline Si-region or Si-layer. In other embodiments, polycrystalline or amorphous silicon may be employed.

It should, however, be understood that the semiconductor body 10 and its doped regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor device applications currently mainly Si, SiC, GaAs and GaN materials are used.

Spatially relative terms such as "under", "below", "above", "lower", "over", "upper" and the like, are used for ease of description to explain the positioning of one element relative to a second element. These terms are intended to encompass different orientations of the respective device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

LIST OF REFERENCE SIGNS

1 Power semiconductor device
10 Semiconductor body
10-1 Front side
10-2 Backside
100 Drift region
109 Chip edge
11 First load terminal structure
111 Metal and/or polysilicon layer
111-1 Lateral edge
12 Second load terminal structure
13 Soft passivation layer
14 Power cell(s)
141 Trench
142 Body region
143 Source region
15 Insulation layer
151 Lateral edge of the insulation layer
16 Active region
17 Edge termination region
171 Edge termination structure
1711 Doped semiconductor region
1712 Semi-insulating layer 1715 Oxide layer
172 Protection region
174 Metal layer
174-1 Lateral edge
178 Polysilicon layer
18 Hard passivation layer
181 Oxide layer
182 Nitride layer
D Drainage cell
d2 Oxide layer thickness
d3 Nitride layer thickness
d4 Minimum distance
d5 Lateral distance
d6 Metal layer thickness
d7 Metal layer thickness
GR Gate runner electrode
H Contact hole
LX1 Lateral extension range
LX2 Lateral extension range
LX3 Lateral extension range
X First lateral direction
Y Second lateral direction
Z Vertical direction

What is claimed is:

1. A power semiconductor device having a power semiconductor transistor configuration and comprising:
a semiconductor body having a front side coupled to a first load terminal structure, a backside coupled to a second load terminal structure, and a lateral chip edge;
an active region configured to conduct a load current between the first load terminal structure and the second load terminal structure in a conducting state of the power semiconductor device;
an edge termination region separating the active region from the lateral chip edge;
a hard passivation layer arranged at the front side in at least a portion of the edge termination region; and
a soft passivation layer arranged above a portion of the hard passivation layer,
wherein at the front-side, the edge termination region comprises a protection region which does not comprise any metallic structure, unless the metallic structure is electrically shielded from below by a polysilicon layer that extends further towards the lateral chip edge than the metallic structure by a lateral distance of at least 20 µm,
wherein in a blocking state of the power semiconductor device, the protection region is configured to accommodate a voltage change of at least 90% of a blocking voltage inside the semiconductor body in a lateral direction from the active region towards the lateral chip edge.

2. The power semiconductor device of claim 1, wherein in a vertical cross-section, the protection region extends along the lateral direction from a starting point to the lateral chip edge, and wherein the starting point is located at a distance of at most 30 µm from an outermost point where a doped semiconductor region is in contact with a metal and/or polysilicon layer that is electrically connected with the first load terminal structure.

3. The power semiconductor device of claim 1, wherein the hard passivation layer comprises an oxide layer having an oxide layer thickness, and wherein the hard passivation layer extends further towards the active region than the protection region at most by a lateral distance of 10 times the oxide layer thickness.

4. The power semiconductor device of claim 1, wherein the hard passivation layer does not laterally extend further towards the active region than the protection region.

5. A power semiconductor device, comprising:
a semiconductor body having a front side coupled to a first load terminal structure, a backside coupled to a second load terminal structure, and a lateral chip edge;
an active region configured to conduct a load current between the first load terminal structure and the second load terminal structure in a conducting state of the power semiconductor device;
an edge termination region separating the active region from the lateral chip edge;
an insulation layer arranged at the front side, wherein a lateral edge of the insulation layer defines a contact hole, the contact hole being filled with a metal and/or polysilicon layer that is in contact with a doped semiconductor region of the semiconductor body; and
a hard passivation layer that is formed from a hard passivation material and arranged at the front side at least in a portion of the edge termination region such that the hard passivation layer does not extend above the lateral edge of the insulation layer and the hard passivation layer at least partially covers the polysilicon and/or metal layer,
wherein the contact hole is defined by a second lateral edge of the insulation layer that is opposite the lateral edge of the insulation layer, and
wherein the power semiconductor device is configured such that no regions of the hard passivation material which at least partially cover the polysilicon and/or metal layer extend over the lateral edge or the second lateral edge.

6. The power semiconductor device of claim 5, wherein the hard passivation layer is arranged exclusively between the contact hole and the lateral chip edge.

7. The power semiconductor device of claim 5, wherein the hard passivation layer comprises an oxide layer having an oxide layer thickness, and wherein the hard passivation layer laterally terminates at a minimum distance of at least once the oxide layer thickness from a vertical projection of the lateral edge of the insulation layer.

8. The power semiconductor device of claim 5, further comprising a metal layer electrically connected with the first load terminal structure.

9. The power semiconductor device of claim 5, wherein the polysilicon and/or metal layer filling the contact hole is covered at least partially by a soft passivation layer.

10. A power semiconductor device, comprising:
a semiconductor body having a front side coupled to a first load terminal structure, a backside coupled to a second load terminal structure, and a lateral chip edge;
an active region configured to conduct a load current between the first load terminal structure and the second load terminal structure in a conducting state of the power semiconductor device;
an edge termination region separating the active region from the lateral chip edge;
a hard passivation layer arranged at the front side at least in a portion of the edge termination region, the hard passivation layer comprising an oxide layer having an oxide layer thickness;
a metal layer arranged at the front side at least in a portion of the edge termination region and having a lateral edge; and
an insulation layer arranged at the front side at least in a portion of the edge termination region, wherein a lateral edge of the insulation layer is covered by the metal layer, wherein in a cross-section along a vertical direction pointing from the front side to the backside, the cross-section is perpendicular to the lateral edge and a common lateral extension range of the hard passivation layer and the metal layer amounts to at most 10 times the oxide layer thickness, wherein the common lateral extension range does not extend across any lateral edge of the insulation layer within the edge termination region.

11. The power semiconductor device of claim 10, wherein at any lateral edge of the metal layer in the edge termination region, in a vertical cross-section perpendicular to the lateral edge, the common lateral extension range of the hard passivation layer and the metal layer amounts to at most 10 times the oxide layer thickness.

12. The power semiconductor device of claim 10, wherein the common lateral extension range amounts to at most 10 times a metal layer thickness of the metal layer at the lateral edge.

13. The power semiconductor device of claim 10, wherein the metal layer forms at least a portion of a gate runner electrode.

14. The power semiconductor device of claim 10, wherein the metal layer establishes an electrical connection between a drainage cell and the first load terminal structure.

15. The power semiconductor device of claim 10, wherein the hard passivation layer comprises a nitride layer.

16. The power semiconductor device of claim 10, further comprising a soft passivation layer arranged above at least a portion of the hard passivation layer.

17. The power semiconductor device of claim 10, further comprising an edge termination structure arranged at the front side and configured to laterally terminate an electric field that is present in the semiconductor body in a blocking state of the power semiconductor device, and wherein the hard passivation layer is arranged above at least a portion of the edge termination structure.

18. The power semiconductor device of claim 17, wherein the edge termination structure comprises at least one of: a junction-termination-extension structure, a variation-of-lateral-doping structure, a field plate termination structure and a field ring/field plate termination structure.

19. The power semiconductor device of claim 10, wherein the power semiconductor device is or comprises an IGBT.

20. The power semiconductor device of claim 6, further comprising a soft passivation layer, wherein the soft passivation layer covers the hard passivation layer and the metal layer, wherein the soft passivation layer extends over both of the lateral edge and the second lateral edge of the contact hole.

* * * * *

UNITED STATES PATENT AND TRADEMARK OFFICE
CERTIFICATE OF CORRECTION

| | |
|---|---|
| PATENT NO. | : 11,387,359 B2 |
| APPLICATION NO. | : 16/713392 |
| DATED | : July 12, 2022 |
| INVENTOR(S) | : Humbel et al. |

It is certified that error appears in the above-identified patent and that said Letters Patent is hereby corrected as shown below:

On the Title Page

Item (54) and in the Specification Column 1/title (Line 1), please change "PPOWER" to -- POWER --.

Signed and Sealed this
Twentieth Day of September, 2022

*Katherine Kelly Vidal*

Katherine Kelly Vidal
*Director of the United States Patent and Trademark Office*